United States Patent
Martin

(10) Patent No.: US 9,184,727 B2
(45) Date of Patent: Nov. 10, 2015

(54) SAW DEVICE AND METHOD FOR POST-SEAL FREQUENCY TRIMMING

(75) Inventor: Tom A. Martin, Canton, CT (US)

(73) Assignee: Phonon Corporation, Simsbury, CT (US)

( * ) Notice: Subject to any disclaimer, the term of this patent is extended or adjusted under 35 U.S.C. 154(b) by 657 days.

(21) Appl. No.: 13/493,536

(22) Filed: Jun. 11, 2012

(65) Prior Publication Data

US 2013/0328643 A1 Dec. 12, 2013

(51) Int. Cl.
*H03H 9/10* (2006.01)
*H03H 9/25* (2006.01)
*H01L 41/22* (2013.01)

(52) U.S. Cl.
CPC .............. *H03H 9/25* (2013.01); *H03H 9/1071* (2013.01)

(58) Field of Classification Search
CPC ......... H03H 9/42; H03H 9/1064; H03H 9/25; H03H 9/10; H01L 41/39
USPC .............. 333/193–196; 310/313 R, 343, 344; 29/25.35
See application file for complete search history.

(56) References Cited

U.S. PATENT DOCUMENTS

| | | | |
|---|---|---|---|
| 7,010,837 B2 * | 3/2006 | Takata et al. | 29/25.35 |
| 7,385,463 B2 * | 6/2008 | Koga et al. | 333/133 |
| 7,579,759 B2 * | 8/2009 | Lee et al. | 310/358 |
| 7,888,842 B2 * | 2/2011 | Pereira da Cunha et al. | 310/324 |
| 8,698,376 B2 * | 4/2014 | Chen et al. | 310/328 |

* cited by examiner

*Primary Examiner* — Dean Takaoka
(74) *Attorney, Agent, or Firm* — Alix, Yale & Ristas, LLP

(57) ABSTRACT

A surface acoustic wave (SAW) device includes a piezoelectric crystal substrate on which an acoustic channel is formed, at least one electro-mechanical transducer operatively associated with the acoustic channel, and an encapsulating casing having a cover spaced above the acoustic channel and thereby defining a sealed volume around the substrate. A mass deposition device within the casing is spaced between the acoustic channel and the cover, preferably as gold-coated heating wire spanning the acoustic channel and having ends that are connectable to an electric power source outside the casing. Stress and aging shifts can be induced after sealing of the cover. Tuning is achieved by evaporating metal molecules off the heated wire onto the acoustic channel as the frequency is monitored, until the mass loading of metal molecules on the transducer produces the target frequency.

11 Claims, 3 Drawing Sheets

SAW DEVICE AND METHOD FOR POST-SEAL FREQUENCY TRIMMING

BACKGROUND

The present invention relates to frequency trimming of surface acoustic wave (SAW) devices.

SAW devices utilize the localized propagation of acoustic waves on the working surface of a planar piezoelectric substrate. SAW transduction between electrical signals and acoustic waves is accomplished by thin film metallic interdigital electrodes on the substrate surface. A typical SAW device includes a substrate die with associated acoustic channel and transducers on the working surface, adhered to a base and sealingly enveloped within a package including a metal cover.

The SAW device to be delivered to the end user must meet very tight tolerances on the target output frequency. Generally, some form of frequency trimming is employed as a last step during manufacture, such as by fabricating the device for a higher frequency output than the target frequency and then trimming by adding effective mass to the working surface, especially the acoustic channel. SAW device frequency can be trimmed by several methods before the cover is sealed, but once sealed the device is subject to further random frequency shifts due to the sealing process, environmental stress, screening, and aging. These shifts can significantly reduce product yield. In one known but atypical technique for post-seal trimming, material adhered to the inside of a sealed, transparent cover is ablated by a laser onto the acoustic channel, but this is difficult and expensive to implement.

SUMMARY

An object of the present invention is to simplify the frequency trimming of SAW devices after the cover has been sealed.

A surface acoustic wave (SAW) device is disclosed, comprising a piezoelectric crystal substrate on which is formed an acoustic channel; at least one electro-mechanical transducer operatively associated with the acoustic channel; an encapsulating casing having a cover spaced above the acoustic channel and thereby defining a sealed volume around the substrate; and a mass deposition device within the casing, spaced between the acoustic channel and the cover.

The mass deposition device can comprise an electrical resistant heating element adapted to heat a source of non-electrically conductive heavy molecular weight material, such as heavy metal, to a temperature at which molecules of the evaporate in the gas-filled sealed volume.

The mass deposition device is preferably a wire spanning the acoustic channel and having ends that are conductively connected to activation terminals that can be electrically powered from outside the casing. Metal molecules are evaporated off the heated wire onto the acoustic channel.

In an especially preferred embodiment, a thin (<0.025 mm) Au (gold) plated W (tungsten) wire is permanently wire-bonded between two central pins or pads of the SAW device package so that the mid span of the Au/W is closely spaced (e.g., ~1 mm) above the mid-point of the acoustic channel. The SAW device is pre-seal trimmed to above the desired frequency (e.g., by 100-1000 ppm), then sealed, such as in one atmosphere of an inert gas such as $N_2$ (nitrogen). After environmental stress screening and aging, the SAW device is ready for post-seal trim. A carefully controlled DC or pulsed current is passed through the Au/W wire while the frequency is monitored. Au is evaporated from the hot Au/W wire, diffused through gas and condensed on the SAW die surface. This material deposition causes the frequency to decrease as much as 1000 ppm due to mass loading.

The deposited Au layer on the SAW die is extremely thin (e.g., <1 nm) and non-electrically-conductive. Au has sufficient vapor pressure at 1500 deg. C. to evaporate in one atmosphere of $N_2$, whereas the W melts at 3200 deg. C. and therefore remains unchanged throughout the process and afterward. The gaseous environment has the beneficial effect of decreasing the mean free path length of the large and heavy gold molecules, so that they diffuse in random paths and thereby produce a more uniform distribution when landing on the acoustic channel. The very thin layer of gold is a poor conductor of electricity, so will not interfere with the electro-mechanical transduction. The frequency shift is very sensitive to even slight changes in the effective mass of the acoustic channel, so molecular deposition for only a few seconds can be sufficient, with deposited molecules covering only a small fraction of the surface area of the acoustic channel.

The method embodiment includes the steps of pre-tuning the acoustic channel to an initial frequency above a target frequency; encapsulating the pre-tuned working surface in a casing having a cover spaced above the working surface and thereby defining a sealed volume; and trimming the frequency to the target frequency by depositing molecules on the working surface from a material source situated in the sealed volume below the cover, while monitoring a resulting decrease in frequency toward the target frequency.

Factors that contribute to frequency shift can be minimized by subjecting the sealed device to at least one but preferably both of environmental stress and aging before trimming the frequency with mass deposition.

The invention can be used for a wide variety of SAW devices, including filters, resonators, and the like, with or without heaters or temperature control, and when temperature control is present, regardless of the form or placement of heating elements, temperature sensor, and controller.

BRIEF DESCRIPTION OF THE DRAWING

Various embodiments are depicted in the accompanying drawing, in which.

DETAILED DESCRIPTION

Figure 1:
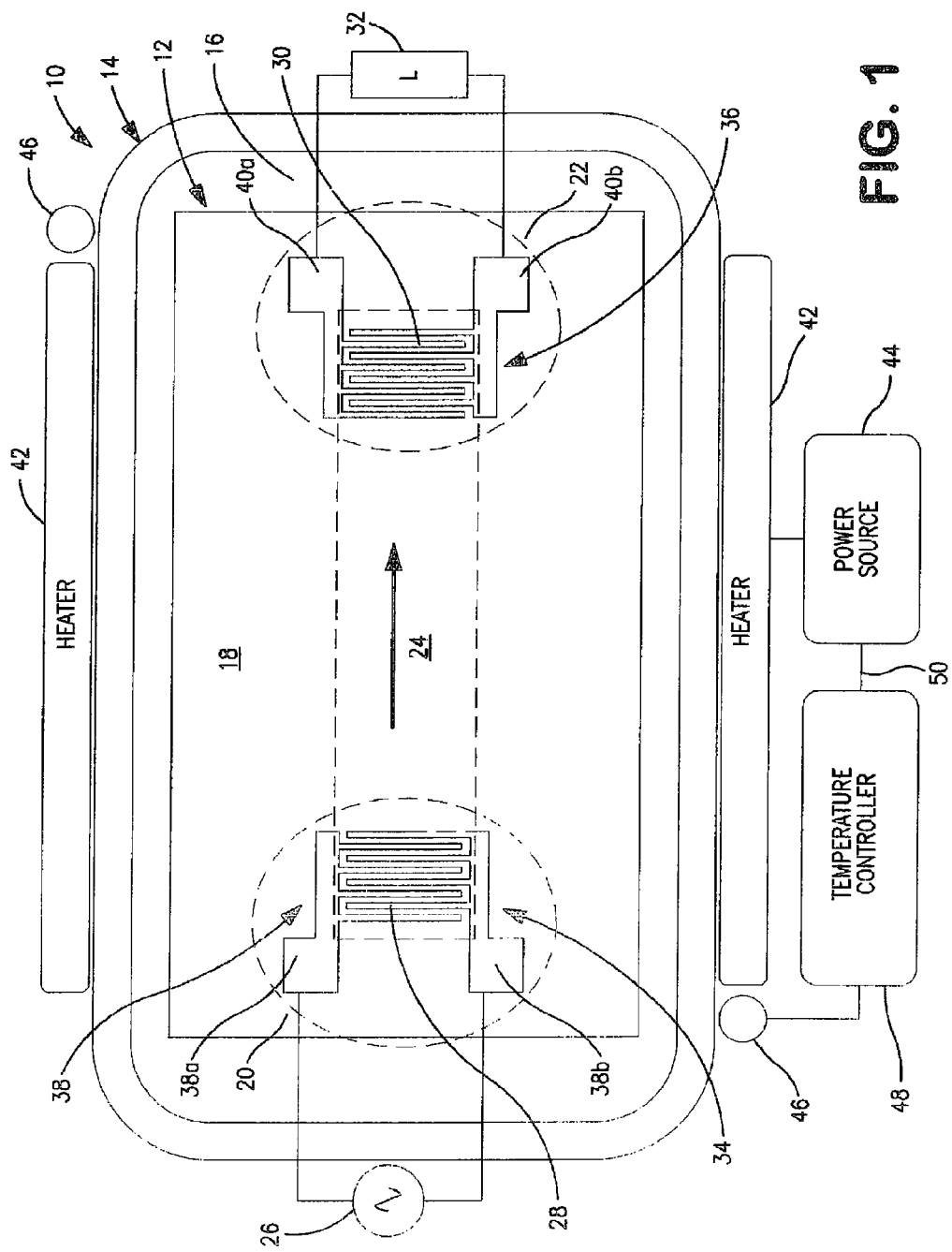
FIG. 1 is a schematic of a conventional SAW band pass filter in a case with optional temperature control using heaters external to the substrate.

FIG. 1 represents a conventional band pass SAW filter 10 comprising a piezo electric crystal substrate 12 encapsulated by casing 14 with intervening air gap 16. The working surface 18 of the substrate is capable of transmitting acoustic surface waves, which are induced by input electric-to-mechanical transducer 20 and received by output mechanical-to-electric transducer 22. The transducers 20, 22 are aligned with an axis of the crystalline structure of substrate 12, such that the transducer waveforms travel along such axis on an active zone 24 of the working surface 18.

A source 26 of electrical input signal is delivered to a plurality of electrically conductive interdigital transducer fingers 28, which by means of a piezo electric effect, generate an acoustic wave response on the active zone 24 according to the designed filter wavelength frequency selectivity. The filtered mechanical signal is picked up by the interdigital fingers 30 of the of the output transducer 22, and delivered to load 32. Generally, the wire leads of the source 26 and load 32 are connected to respective bus conductors 34, 36 at enlarged pads 38, 40. The fingers 28, 30 buses 34, 36 and pads 38, 40 are typically formed on the working surface monolithically 18 by any of a variety of well-known lithographic processes.

It is well known that the acoustic propagation in the active zone 24 is temperature dependent. Typically, but not necessarily, a so-called "oven" is provided to maintain the crystal 12 at a constant temperature above the highest ambient temperature for which the SAW device is rated. In FIG. 1, the oven is provided by a plurality of heater elements 42 on the outside surface of the casing 14. The heat must pass through the air space 16 where temperature gradients in the casing are reduced such that the hot air in contact with the lateral surfaces of the crystal 12 is of substantially uniform temperature. A source of power 44 is connected to the heating elements 42, and temperatures sensors 46 and associated controller 48 provide a control heater control signal 50 to the power source 44.

Figure 2:
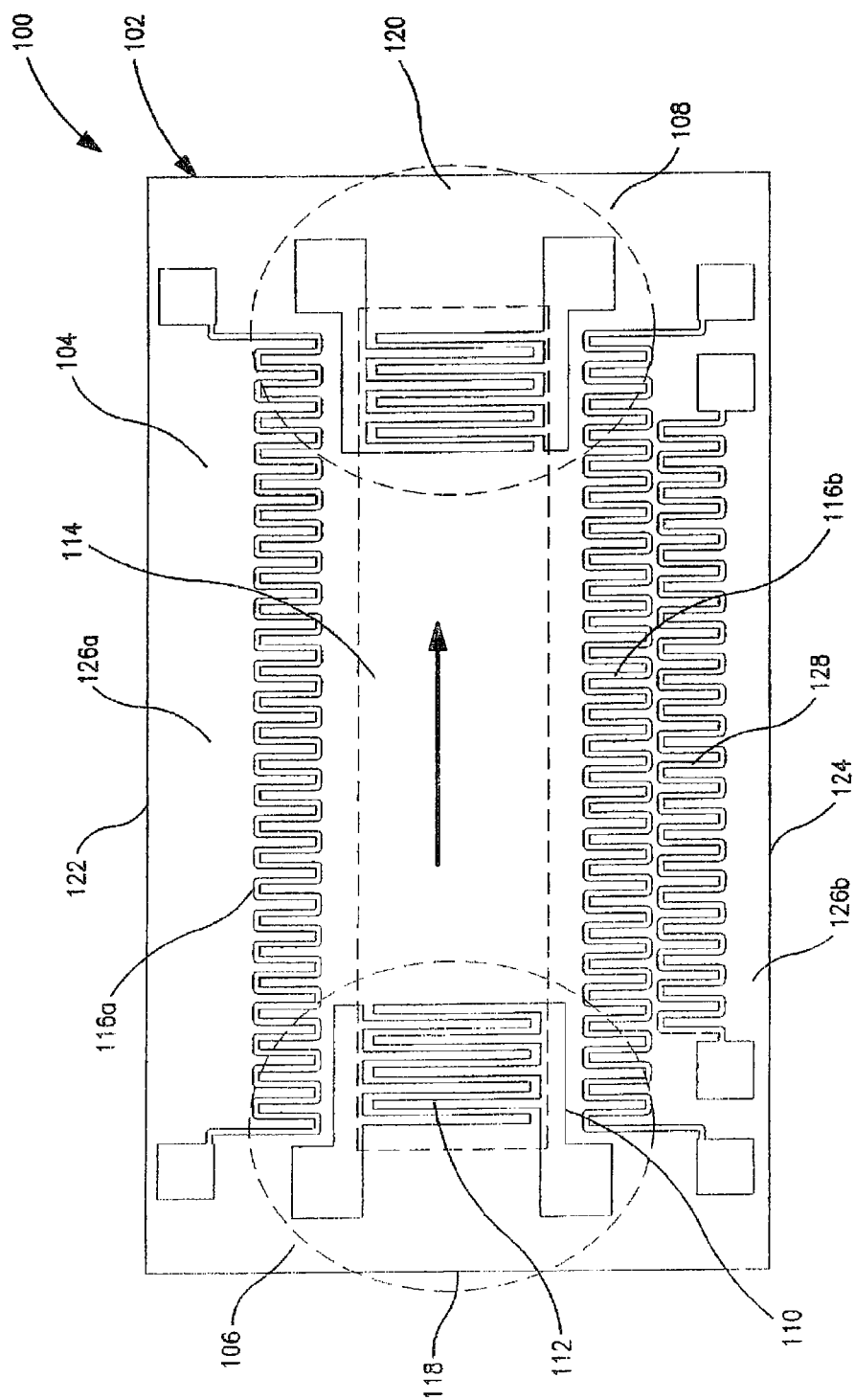
FIG. 2 is a schematic of the main operative portion of a SAW band pass filter having heaters monolithically adhered to the substrate.

FIG. 2 shows one embodiment 100 of a different temperature control system in a band pass filter of the type show in FIG. 1. The piezo electric crystal 102 has substantially the same working surface 104, input transducer 106, output transducer 108, buses (represented at 110), interdigital fingers (represented at 112) and active zone 114 (represented by a dashed rectangle) as described with respect to FIG. 1. The most significant difference is that the heating elements 116A, B are provided on the working surface 104. In FIG. 2 (likewise FIG. 1) the working surface 104 is substantially rectilinear with opposite input and output ends 118, 120 and opposite sides 122,124. The transducers 106, 108 are adjacent the input and output ends 118, 120, with the active zone 114 situated between and including the transducers 106, 108. The heating elements 116A and 116B can be situated along side margins 126A and 126B of the working surface 104, between the active zone 114 and the sides 122, 124 of the working surface 104 of the substrate 102. Importantly, the heating elements 116 are in a much more intimate relationship with the active zone 114 than is possible with conventional ovens.

The temperature sensor 128 is likewise in a more intimate relationship with the active zone. In FIG. 2, the sensor 128 is on the side margin 126B of the working surface, between the heating element 116B and the side 124 of the working surface 104, but as will be described below, a plurality of sensor are preferably situated between the heating elements and the active zone.

In a further variation, the heating elements 116 are formed monolithically with at least the transducers 106, 108. The term "monolithic" when used herein should be understood as in the field of semi-conductor technology, i.e., formed on a single crystal substrate. The heating elements 116 preferably comprise at least one group of thin film metallic meander resistor electrodes. Similarly, the temperature sensor 128 of FIG. 2 comprises at least one differently formed group of thin film metallic meander resistor electrodes.

Figure 3:
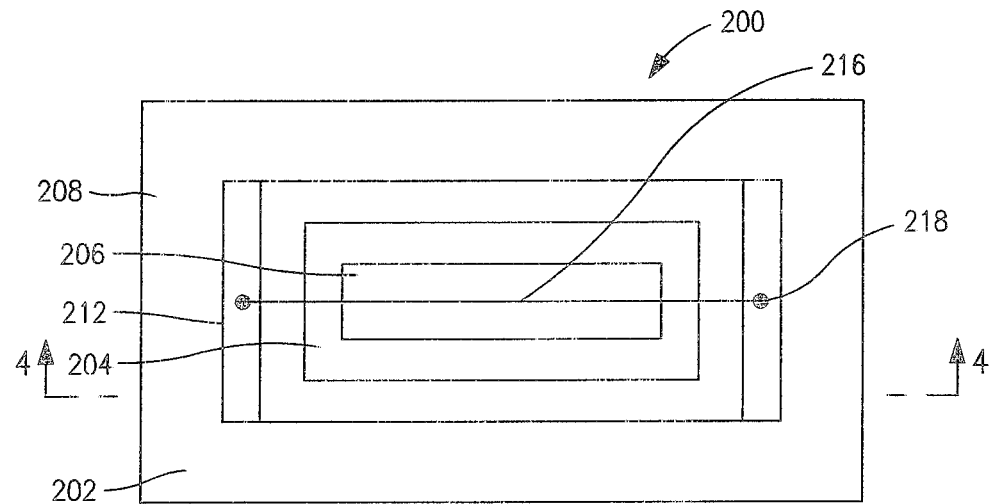
FIG. 3 is a schematic plan view of a SAW device incorporating an embodiment of the present invention that can be implemented in a SAW device without temperature control.
Figure 4:
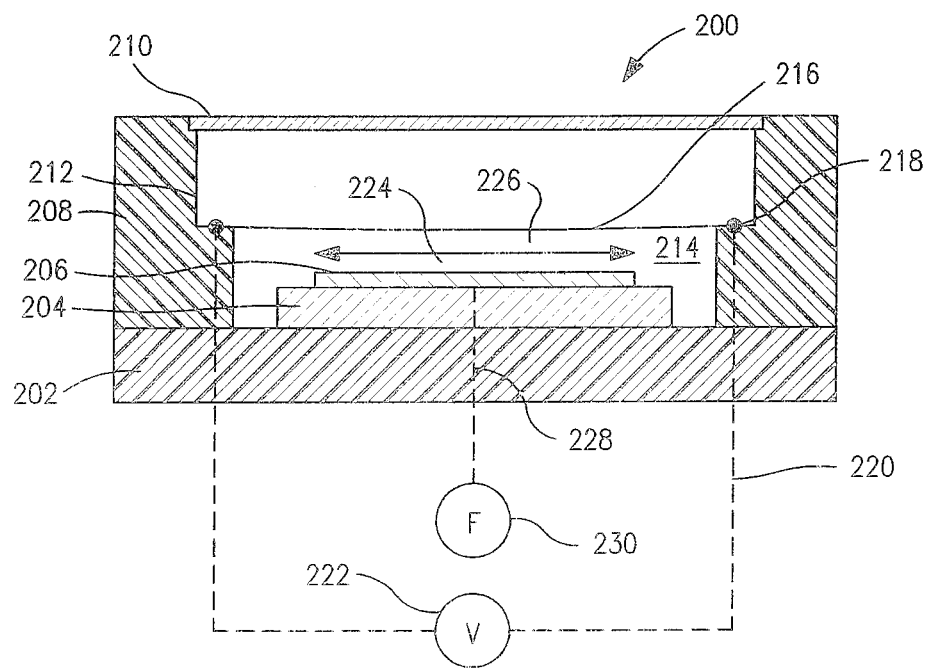
FIG. 4 is a section view along cut line 4-4 of FIG. 3.

FIGS. 1 and 2 are presented to establish a context for the simplified depictions of the invention in FIGS. 3 and 4. A generalized SAW device 200 has a base 202 on which a substrate or die 204 is adhered (as by glue or the like). The die 204 is elongated in the direction of acoustic wave propagation and encapsulated by a casing wall 208 and preferably transparent cover 210. In the illustrated embodiment, the short ends of the cover 210 are sealed against the outer surfaces of shelves 212 which are spaced apart in the longitudinal direction of the die and act as hard stops for the cover, and the long sides of the cover are sealed against the long sides of the casing wall 208 in any convenient manner. This forms a sealed volume 214 including space between the acoustic channel 206 and the cover 210.

It should be appreciated that in the simplified depiction of FIGS. 3 and 4, an acoustic channel 206 is shown as formed on the working surface of die 204, but other features such as the transducers, heaters, sensors, wire bonds or pads, and the like can be on the die or off the die and are not shown as they are not connected to or do not interact with the features associated with the present invention, and some need not present at all. Thus, the invention can be used for a wide variety of SAW devices, including filters, resonators, and the like, with or without heaters or temperature control.

In accordance with one aspect of the invention, a mass deposition device is permanently situated within the casing, spaced between the acoustic channel 206 and the cover 210. In the illustrated embodiment the mass deposition device is a wire 216 spanning the acoustic channel 206 and having ends connected to pins, pads, or posts 218 that are conductively connected via leads 220 to activation terminals that can be electrically powered from outside the casing by, e.g., a DC or pulsed voltage source 222. The wire 216 is suspended above the acoustic channel 206 from the pins 218 such that the lowest, mid-portion of the wire is above and closely spans (indicated at 224) the longitudinal centerline of the acoustic channel 206, by preferably about 1-2 mm (indicated at 226).

The wire 216 preferably has a tungsten core and a coating of gold at least over the span 224, whereby powering of the wire at 222 heats the wire and evaporates gold onto the acoustic channel 206. Deposition of gold on adjacent areas of the working surface (such as on the transducers) is not precluded, as any mass deposition that affects the generation or propagation of the acoustic waves can reduce the frequency. The term acoustic channel should be understood as including such adjacent areas.

During the trimming operation, the output lead from the SAW device (indicated at 228) is connected to a frequency meter 230. The method includes the steps of pre-tuning the acoustic channel 206 with any known technique to an initial frequency above a target frequency and thereafter encapsulating the die 204 with a pre-tuned working surface in a casing having a cover 210 spaced above the working surface and thereby defining a sealed volume 214. The sealed SAW device may be subjected to at least one and preferably both of environmental stress and aging before trimming the frequency with mass deposition. The frequency is trimmed to the target frequency by activating the power source 222 and thereby depositing molecules on the working surface from the material source 216, while monitoring the resulting decrease in frequency at 230 toward the target frequency.

In an especially preferred embodiment, a thin (<0.025 mm) Au (gold) plated W (tungsten) wire 216 is employed. The SAW device is pre-seal trimmed to above the desired frequency (e.g., by 100-1000 ppm), then sealed, such as in one atmosphere of an inert gas, preferably $N_2$ (nitrogen). Au is evaporated from the hot Au/W wire, diffused through the gas and condensed on the SAW die surface. This material deposition causes the frequency to decrease as much as 1000 ppm due to mass loading.

The invention claimed is:

1. A surface acoustic wave (SAW) device comprising: a piezoelectric crystal substrate; a working surface of the substrate capable of transmitting acoustic waves along an acoustic channel; at least one electro-mechanical transducer operatively associated with the working surface for inducing said waves to travel along said channel and for receiving said waves; an encapsulating casing having a cover spaced above the working surface and thereby defining a sealed volume filled with pressurized gas; and a molecular deposition device within the casing, above the acoustic channel; wherein the molecular deposition device is a wire spanning the acoustic channel below the cover and having ends that are conductively connected to activation terminals that can be electrically powered from outside the casing.

2. The SAW device of claim 1, wherein the acoustic channel has a layer of deposited molecules.

3. The SAW device of claim 1, wherein the wire has a tungsten core and a coating of gold, whereby powering of the wire heats the wire and evaporates gold onto the acoustic channel.

4. The SAW device of claim 1, wherein the wire is coated with a heavy metal.

5. The SAW device of claim 1, wherein the gas in the sealed volume is nitrogen.

6. A surface acoustic wave (SAW) device, comprising
a piezoelectric crystal substrate on which is formed an acoustic channel;
at least one electro-mechanical transducer operatively associated with the acoustic channel;
an encapsulating casing having a cover spaced above the acoustic channel and thereby defining a sealed volume around the substrate; and
a mass deposition device within the casing, spaced between the acoustic channel and the cover;
wherein the mass deposition device comprises an electrical resistant heating element adapted to heat a source of non-electrically conductive heavy molecular weight material to a temperature at which molecules of the heavy material evaporate in the sealed volume.

7. The SAW device of claim 6, wherein the heavy molecular weight material is a heavy metal and the sealed volume is pressurized with nitrogen gas.

8. The SAW device of claim 7, wherein the mass deposition device is a wire spanning the acoustic channel and having ends that are conductively connected to activation terminals that can be electrically powered from outside the casing.

9. The SAW device of claim 8, wherein the wire is made of tungsten and the heavy metal is gold.

10. A frequency tuned surface acoustic wave (SAW) device, comprising a piezoelectric crystal substrate on which is formed an acoustic channel; at least one electro-mechanical transducer operatively associated with the acoustic channel; an encapsulating casing having a cover spaced above the acoustic channel and thereby defining a sealed volume around the substrate; a mass deposition device permanently supported within the casing, spaced between the acoustic channel and the cover; wherein the mass deposition device is a wire spanning the acoustic channel below the cover and having ends that are conductively connected to activation terminals accessible on the casing.

11. The SAW device of claim 10, wherein the acoustic channel has a deposited mass layer of heavy-weight molecules.

* * * * *